(12) United States Patent
Schön et al.

(10) Patent No.: US 11,441,223 B2
(45) Date of Patent: Sep. 13, 2022

(54) SUSCEPTOR FOR A CVD REACTOR

(71) Applicant: AIXTRON SE, Herzogenrath (DE)

(72) Inventors: Oliver Schön, Herzogenrath (DE);
Francisco Ruda Y Witt, Eschweiler (DE); Marcus Schaffrath, Alsdorf (DE)

(73) Assignee: AIXTRON SE, Herzogenrath (DE)

( * ) Notice: Subject to any disclaimer, the term of this patent is extended or adjusted under 35 U.S.C. 154(b) by 168 days.

(21) Appl. No.: 16/495,997

(22) PCT Filed: Mar. 6, 2018

(86) PCT No.: PCT/EP2018/055457
§ 371 (c)(1),
(2) Date: Sep. 20, 2019

(87) PCT Pub. No.: WO2018/172063
PCT Pub. Date: Sep. 27, 2018

(65) Prior Publication Data
US 2020/0149163 A1     May 14, 2020

(30) Foreign Application Priority Data
Mar. 20, 2017   (DE) .................... 10 2017 105 947.4

(51) Int. Cl.
*C23C 16/458*    (2006.01)
*C23C 16/46*     (2006.01)

(52) U.S. Cl.
CPC ...... *C23C 16/4581* (2013.01); *C23C 16/4584* (2013.01); *C23C 16/4586* (2013.01); *C23C 16/46* (2013.01)

(58) Field of Classification Search
CPC ............ C23C 16/4581; C23C 16/4584; C23C 16/4586; C23C 16/46
(Continued)

(56) References Cited

U.S. PATENT DOCUMENTS 5,782,979 A * 7/1998 Kaneno ................. C23C 16/301
                                                            118/500
2002/0090454 A1   7/2002 Paisley et al.
(Continued)

FOREIGN PATENT DOCUMENTS

DE    10 2014 100 024 A1    7/2015
DE    10 2014 103 505 A1    9/2015
(Continued)

OTHER PUBLICATIONS

International Search Report dated Jun. 15, 2018, from the ISA/European Patent Office, for International Patent Application No. PCT/EP2018/055457 (filed Mar. 6, 2018), 7 pages.
(Continued)

*Primary Examiner* — Charlee J. C. Bennett
(74) *Attorney, Agent, or Firm* — Ascenda Law Group, PC

(57) ABSTRACT

A susceptor for a CVD reactor includes a flat circular disc-shaped body with channels that are arranged on a broad side of the disc-shaped body within one or more circular surface sections extending on a plane in order to transfer heat to a substrate holder. The channels run about respective centers of the one or more circular surface sections in a spiral manner and are formed as depressions that are open towards the plane. An end of each of the channels has a channel opening, the channel openings being fluidically connected to a feed opening arranged at the end of a gas supply line. Additionally, the one or more surface sections are equipped with one or more influencing elements that influence the local heat transfer and are formed as open depressions on the plane or as insert pieces that plug into the depressions.

16 Claims, 10 Drawing Sheets

(58) Field of Classification Search
USPC .......................................................... 118/725
See application file for complete search history.

(56) References Cited

U.S. PATENT DOCUMENTS

| | | | |
|---|---|---|---|
| 2005/0051099 A1 | 3/2005 | Preti et al. | |
| 2009/0272323 A1 | 11/2009 | Ito | |
| 2009/0314209 A1* | 12/2009 | Son | H01L 21/68735 118/724 |
| 2010/0200545 A1* | 8/2010 | Koelmel | C23C 16/4584 216/58 |
| 2012/0204796 A1* | 8/2012 | Ruda Y Witt | C23C 16/4583 118/725 |
| 2017/0125258 A1* | 5/2017 | Sato | H01J 37/32009 |

FOREIGN PATENT DOCUMENTS

| | | |
|---|---|---|
| EP | 0242898 B1 | 7/1993 |
| EP | 2963676 A1 | 1/2016 |
| WO | 2011/045241 A1 | 4/2011 |

OTHER PUBLICATIONS

Written Opinion dated Jun. 15, 2018, from the ISA/European Patent Office, for International Patent Application No. PCT/EP2018/055457 (filed Mar. 6, 2018), 7 pages.

International Preliminary Report on Patentability dated Sep. 24, 2019, from the The International Bureau of WIPO, for International Patent Application No. PCT/EP2018/055457 (filed Mar. 6, 2018), 8 pages.

English translation of International Preliminary Report on Patentability with Written Opinion dated Sep. 24, 2019, from the The International Bureau of WIPO, for International Patent Application No. PCT/EP2018/055457 (filed Mar. 6, 2018), 13 pages.

International Preliminary Report on Patentability dated Sep. 24, 2019, from the The International Bureau of WIPO, for International Patent Application No. PCT/EP2018/055457 (filed Mar. 6, 2018), 15 pages.

Written Opinion dated Jun. 15, 2018, from the ISA/European Patent Office, for International Patent Application No. PCT/EP2018/055457 (filed Mar. 6, 2018), English translation, 6 pages.

* cited by examiner

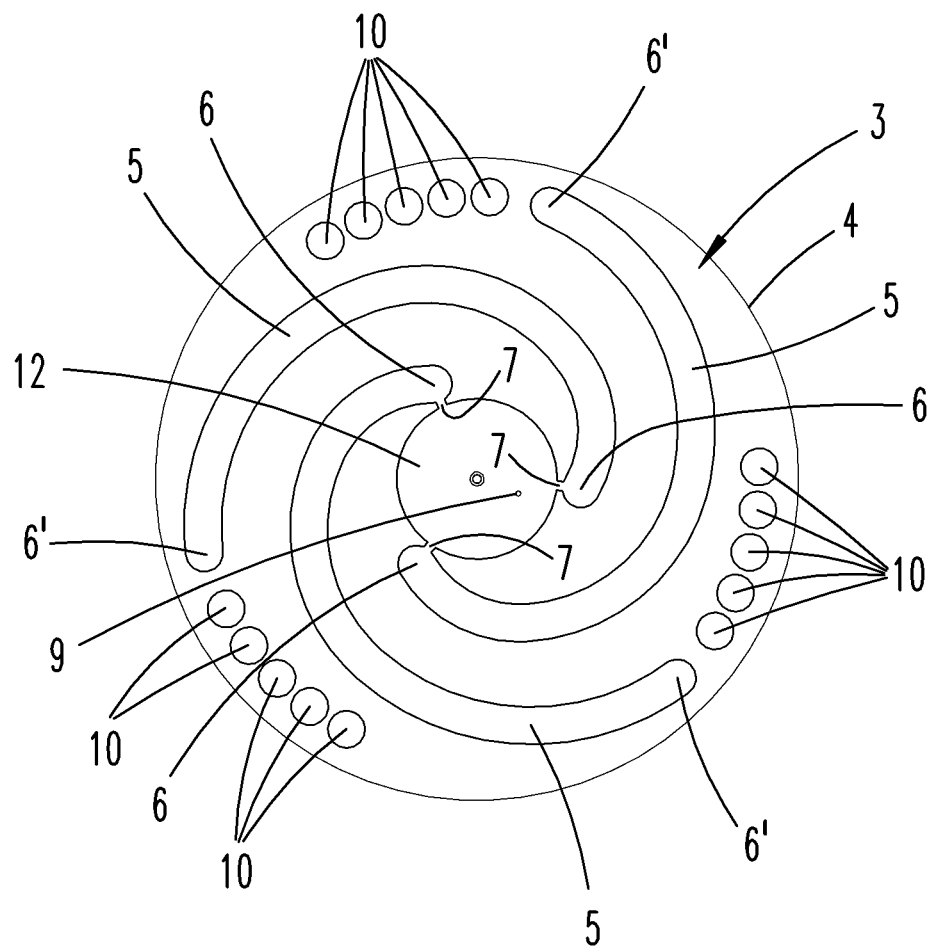

SUSCEPTOR FOR A CVD REACTOR

RELATED APPLICATIONS

This application is a National Stage under 35 USC 371 of and claims priority to International Application No. PCT/EP2018/055457, filed 6 Mar. 2018, which claims the priority benefit of DE Application No. 10 2017 105 947.4.1, filed 20 Mar. 2017.

FIELD OF THE INVENTION

The invention concerns a susceptor for a CVD reactor, consisting of a flat body with at least one circular surface section arranged on a broad side, on which a substrate holder is supported, wherein the surface section has channels open in the direction towards the substrate holder, which are connected in terms of flow to a feed opening arranged at the end of a gas supply line.

The invention also concerns the use of a susceptor, and a susceptor arrangement formed from a substrate holder and a susceptor.

BACKGROUND

EP 0 242 898 B1 discloses a CVD reactor, in which a susceptor is arranged in a reactor housing, which susceptor can be heated from below by a heating device. The susceptor has a plurality of circular surface sections, on each of which is arranged a substrate holder, which has a circular disc shape. A gas supply line flows into the center of the surface section. There, it forms three feed openings, each of which is connected to a radially inner end of channels extending in the form of a spiral about the center. The channels are open to the plane in which the surface section extends, but in the upward direction are covered by a substrate holder. If a purge gas is introduced through the feed openings into the space between the lower face of the substrate holder and the plane of the surface section, the substrate holder is lifted into a ventilated position, in which it is supported on a gas cushion. As a result of the spiral arrangement of the channels in the plane, a directed gas flow forms in the gas gap between the substrate holder and the supporting plane of the surface section, such that the substrate holder, which carries one or a plurality of substrates, is set into rotation. Here the gas is fed into the center of the circular disc-shaped susceptor.

A CVD reactor, the susceptor of which is described in DE 10 2014 100 024 A1, pursues another concept for the feed in of the gas. There the process gas is introduced into the process chamber by a showerhead-like gas outlet surface extending over the entire surface of the susceptor. Here too the susceptor is supplied with heat energy from below. Here, however, the substrates are not located on rotating substrate holders, but in pockets formed by depressions incorporated directly into the susceptor. For purposes of influencing the heat flow from the susceptor to the substrate, the floor of the pocket has a depth profile. The edge of the substrate rests on supporting ribs, or other supporting projections.

DE 10 2014 103 505 A1 discloses insert pieces in the susceptor, which are used in the production of a coating.

In a generic device, heat is continuously transferred from the susceptor to a substrate holder, from which the heat is transferred to a cooled process chamber located opposite the substrate holder. The heat flow is influenced by, amongst other items, the optical properties of the substrate resting on the substrate holder. If the substrate is transparent to infrared radiation, this can lead to a temperature drop in the central region of the substrate holder. However, if the substrate, for example a silicon substrate, is reflective, then the temperatures in the central region under the substrate are higher than near the edge of the substrate holder. In this case, the center must be cooled relative to the edge. Alternatively, the edge can also be heated relative to the center.

SUMMARY OF THE INVENTION

In a generic susceptor, in which a purge gas is fed into a gap between the susceptor upper face and the lower face of a substrate holder, the object underlying the invention is that of compensating, by simple means, for a local temperature inhomogeneity of the substrate holder, and in particular a deviation of the temperature in the center of the substrate holder from the temperature at the edge of the substrate holder.

The object is achieved by the invention specified in the claims. First and foremost, it is proposed that in the surface section provided for the support of the substrate holder, not only the channels, arranged, in particular in the form of a spiral, about a center, for the production of the rotational gas bearing, but also heat transfer influencing elements, are provided. The influencing elements are arranged such that they can locally influence the heat flow from the substrate to the substrate holder. They are designed either as elevations, depressions, or as insert pieces inserted in depressions. In a first variant, in which the influencing elements are designed as open depressions, they form a depression floor, which preferably extends parallel to the extensive plane of the surface section, or is suitably profiled. If the influencing elements are elevations, they project from the surface section in the form of a pedestal, wherein the floor of the elevation lies above the, in particular planar, surface section. The floor is spaced apart from the plane by a defined distance, and can be surrounded by a continuous peripheral wall. The wall has throughout the height of the spacing (defined distance) between the floor of the elevation or depression and the plane forming the edge of the depression. Like the floor, the wall is preferably closed throughout, and preferably does not form an opening, so that gas cannot enter the depression through the wall or the floor, nor can gas escape from the depression through the wall or the floor. Nevertheless, the depressions can also be connected in terms of flow to one of the channels, however this connection in terms of flow is designed such that no appreciable gas flow forms within the depression. However, it is intended that a gas flow is to develop in the channels, the aim of which is the rotational drive of the substrate holder. To this end the channels generate a gas flow with an azimuthal velocity component. In order to give a gas stream fed into the center the velocity component that drives rotation, the channel can extend along the line of a spiral arc. However, it is also possible that the channel is simply formed by openings from which a directed gas flow exits. During operation, the substrate holder is lifted into a ventilated position by the gas flow fed into the channels, wherein the gap between the plane and the lower face of the substrate holder effects a certain sealing with respect to the exit of the gases from the channels, for which purpose, in particular, provision is made for the lower face of the substrate holder to extend in an essentially flat manner over its entire surface. However, the lower face can also be curved, or can have a different structure. The flow is thus essentially formed in the channel. The direction of the channel forces an azimuthal component onto the gas flow. This is preferably achieved in that the channels extend along an Archimedean spiral. In one variant of the invention, insert pieces are provided, which are inserted in depressions. These insert pieces are preferably made from a material that has a different thermal conductivity from that of the susceptor, which is preferably made of graphite. The channels, preferably arranged in a multiple, preferably a three-fold, symmetry about the center, each extend along an arc line, wherein the channels can have such a length and the arc lines can have such a shape that a radial line passing through the center can intersect a plurality of channels, such that the radial line passes through a radially inner section of a first channel and through a radially outer section of a second channel. The surface section preferably forms first circular sectors, in which at least two channels run. Second circular sectors can be adjacent to these first circular sectors, through which second circular sectors only one channel runs in each case. In a preferred configuration of the invention, the influencing elements preferably extend completely, or at least in regions, in the first circular sectors. However, they can also extend completely, or in regions, in the second circular sectors. The angular sum, over which the first circular sectors extend, is preferably more than 180°. The angular sum, over which the second circular sectors extend, is preferably more than 90°. The angular sum of the first circular sectors is preferably greater than the angular sum of the second circular sectors. The two ends of the influencing elements can be located in different first circular sectors, so that the influencing elements extend through a second circular sector. In a development of the invention, provision is made for the influencing elements in the first circular sector and/or in the second circular sector to run between two channels, or also radially outside the two channels. The influencing element can extend along an arc line, which is similar to the profile of the arc line along which the channel extends. The influencing elements can thus extend along arc lines running in the form of a spiral, but can also extend along free-form arc lines. They can be connected to the radially outer end of a channel running along an arc line in the form of a spiral, that is to say, they can extend, in particular, along the extension of the arc line along which the channel runs. However, provision is also made for the depressions to be displaced radially inwards to the radial outer end of the channel, starting at an arc line in the form of a spiral. The additional influencing elements introduced into a surface section have the effect of locally influencing the heat flow to a substrate holder located in a pocket of the susceptor, the floor of which is formed by the surface section. This is achieved either by reducing the heat flow by designing the influencing element as a depression, or by increasing the heat flow by designing the influencing element as an insert piece that has a higher specific conductivity than the susceptor. A local increase of the heat flow can also be achieved by designing the influencing elements as elevations. They project into the gap between the lower face of the substrate holder and the surface section. The gap forming the rotational gas bearing between the lower face of the substrate holder and the surface section is thus locally smaller. The elevations can consist, in particular, of insert pieces inserted in depressions. In particular these take the form of island-shaped projections within the surface section covered by the substrate holder. The channels have a profile in the surface sections, which are otherwise flat or planar, apart from the depressions, such that a gas flow is formed with an azimuthal velocity component, which rotationally drives the substrate holder. The channels preferably run in the form of a spiral about the center of the respective surface section. In one variant of the invention, provision is made for the depressions to have different heights. Thus, in particular, provision is made for the depth of the depressions in the central region to be higher than in the edge region, so that a high heat transfer resistance is achieved in the central region and a lower heat transfer resistance in the edge region. By virtue of the rotation of the substrate holder over the surface section, zones with different heat transfer properties can be arranged azimuthally next to one another. In particular the influencing elements are arranged in the spaces between adjacent channels. The influencing elements can also be formed by one or a plurality of island-shaped depressions, wherein a plurality of island-shaped depressions are preferably arranged one behind another in a chain, wherein a majority of such depressions extend along an elongated surface. Here this can also take the form of a circular arc surface. The depressions are preferably formed by circular openings, such that they can easily be produced with a face milling cutter or a drill. The depressions can also be arranged in parallel, or laterally offset. The influencing elements can also have a polygonal, in particular a triangular, outline. The arrangement of the influencing elements in the surface section can take place in accordance with a multi-fold symmetry. However, provision is also made for asymmetrical variants in which the influencing elements are arranged without symmetry. The insert pieces can be designed such that their free face lies flush with the surface surrounding the insert piece. However, the insert pieces can also be lower or higher in height than the depth of the depression, so that their faces can form the floor of a depression or the floor of an elevation. Insert pieces can be used, which have a higher specific thermal conductivity than that of the surrounding susceptor, as can insert pieces, which have a lower specific thermal conductivity than that of the susceptor.

If the one or plurality of influencing elements influencing the local heat transfer are depressions, the said depressions are constructively different from the channels, such that no active flow is formed in them during the correct operation of the device, in which the substrate holder is lifted into a ventilated position and rotationally driven by feeding a gas flow into the respective channels. The open depressions are designed and arranged such that, at most, an induced flow or a flow effecting a pressure equalisation is formed in them, but which is by no means sufficient to lift or drive the substrate holder into rotation without the gas flows fed into the channels. Thus, in particular, there is no flow through a depression. At best, pressure-balancing flows into or out of the depression can form.

BRIEF DESCRIPTION OF THE FIGURES

In what follows examples of embodiment of the invention are explained with the aid of the accompanying figures. Here:

FIG. 12 shows a further example of an embodiment, in which the depressions 10 are arranged as cylindrical holes in a row one behind another.

DETAILED DESCRIPTION

Figure 8:
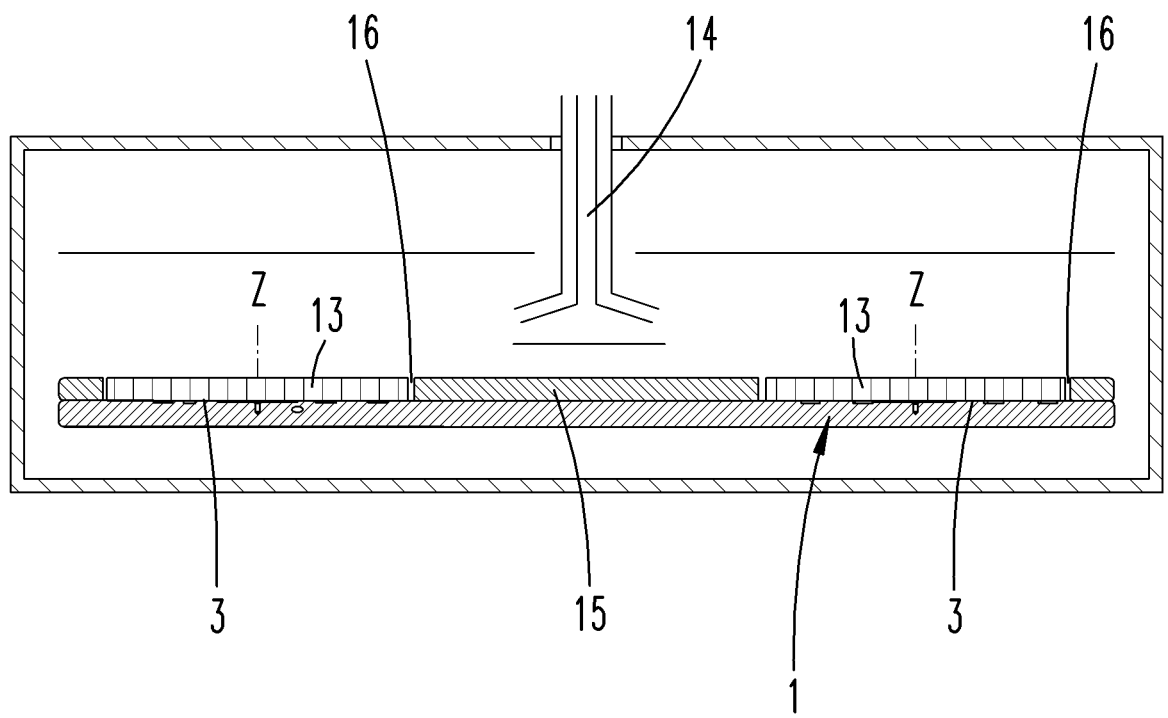
FIG. 8 shows schematically a vertical cross-section through a CVD reactor with a susceptor according to one of the examples of embodiment.

FIG. 8 shows schematically the essential structure of a CVD reactor. A process chamber is arranged in a reactor housing sealed in a gas-tight manner against the external environment, and is supplied with process gases by a gas inlet device 14. A susceptor 1 heated from below has a plurality of surface sections 3, each forming the bottom of a pocket 16, in which a substrate holder 13 is arranged, the upper face of which faces towards the process chamber, and carries one or a plurality of substrates. By feeding a purge gas into the gap between the lower face of the substrate holder 13 and the surface section 3, a gas cushion is created, on which the substrate holder 13 floats. By means of channels 5 arranged in a spiral form about a center Z of the surface section 3, the fed-in gas flow is set into a rotational motion, which drives the substrate holder 13 into rotation.

The feed of the purge gas through a feed opening 9 located in the region of the center Z can have, what is, as a rule however, a minor influence on the homogeneity of the temperature profile on the surface of the substrate holder facing towards the process chamber side. Essentially, however, the temperature profile is influenced by the channels 5, since the gap acts predominantly as a thermal insulator. The substrate has a significant influence on the temperature profile on the surface of the substrate holder facing the process chamber. If the substrate has reflective properties, a temperature rise can occur in the central region, so that the center must be cooled relative to the edge. Alternatively, however, the edge can also be heated relative to the center. If substrates are used that are transparent to thermal radiation, the problem is reversed. This can lead to an increase in temperature at the edge. In accordance with the invention, this temperature inhomogeneity is to be compensated for by means of suitable measures.

To this end the examples of embodiment show heat flow influencing elements, which are formed as depressions 10, or as insert pieces 11 positioned in depressions 10. If the heat influencing elements are designed as insert pieces inserted in depressions, the insert pieces are preferably made from a material whose thermal conductivity is greater than the thermal conductivity of the material that forms the depressions, that is to say, the material of the substrate holder 13, so that the heat influencing elements then lead to a local increase in the temperature on the upper face of the substrate holder. If, on the other hand, the heat influencing elements are simply formed as depressions, they lead to a temperature reduction on the upper face of the substrate holder by virtue of the insulating effect of the gas located in the depressions.

Figure 4:
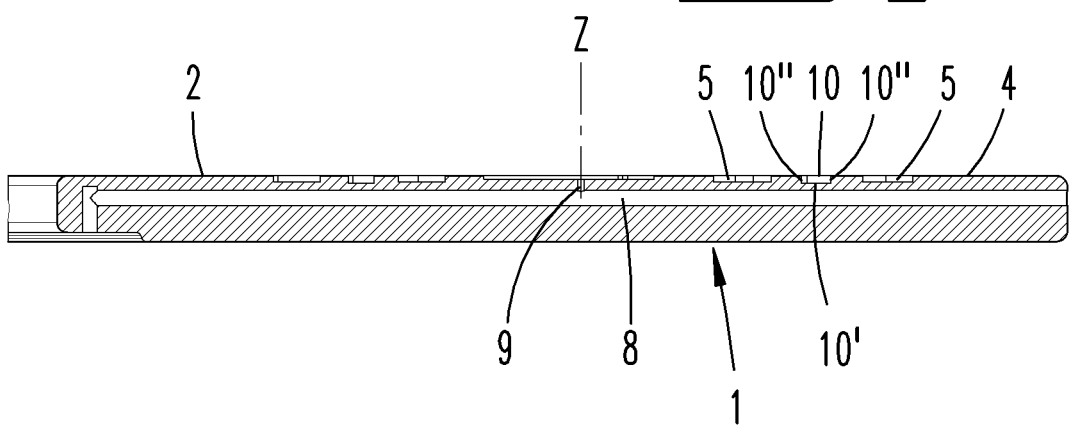
FIG. 4 shows a cross-section along the cutting line IV-IV in FIG. 2.

The cross-section shown in FIG. 4 shows an influencing element in the form of a depression 10, wherein the depression 10 has a floor 10' and walls 10". The walls 10" are in each case formed by a continuous surface, which is bounded at the bottom by the floor 10', and at the top by the edge of the depression 10. The floors 10' of the depression 10 are similarly formed by continuous surfaces that are bounded by the edge of the floor. No gas or the like flows out of the walls 10" and the floor 10' into the depression 10. Neither does gas flow out of the walls 10" or the floor 10' from the depression 10.

Figure 7:
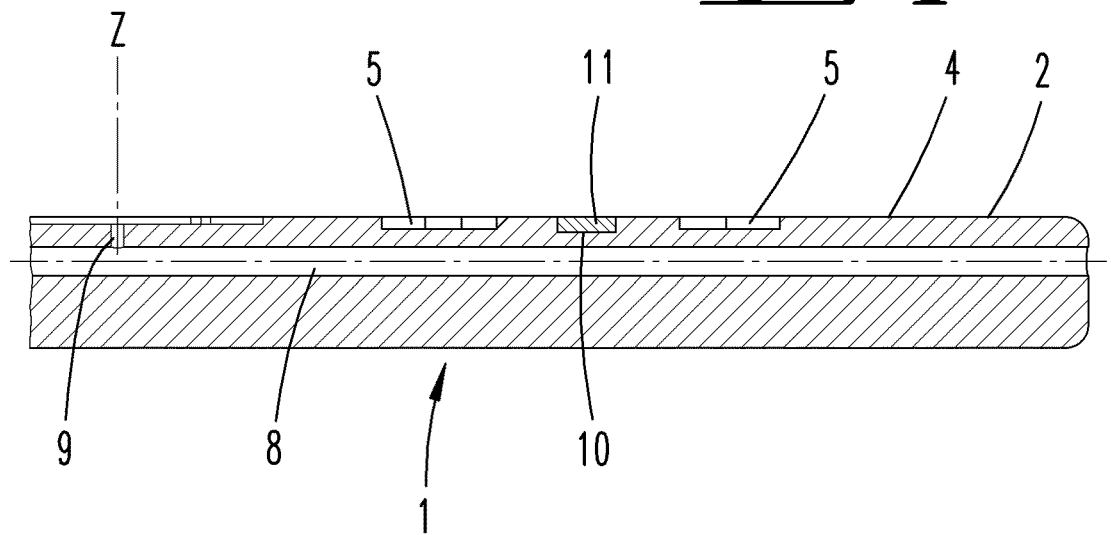
FIG. 7 shows an illustration as in FIG. 4, wherein an insert piece 11 is inserted in a depression 10.

FIG. 7 shows an alternative arrangement of the influencing element. Here it is formed from a solid body as a physical insert piece 11, which is positioned in a depression 10, essentially filling the shape of the latter in the manner of marquetry. It has a different specific conductivity to that of the material of the surrounding susceptor 1.

The depressions 10 shown in FIGS. 2, 3, 5 and 6 can also be fitted with an insert piece 11 in alternative forms of embodiment. In what follows, however, they are described as depressions 10 arranged so as to influence the heat flow.

Figure 1:
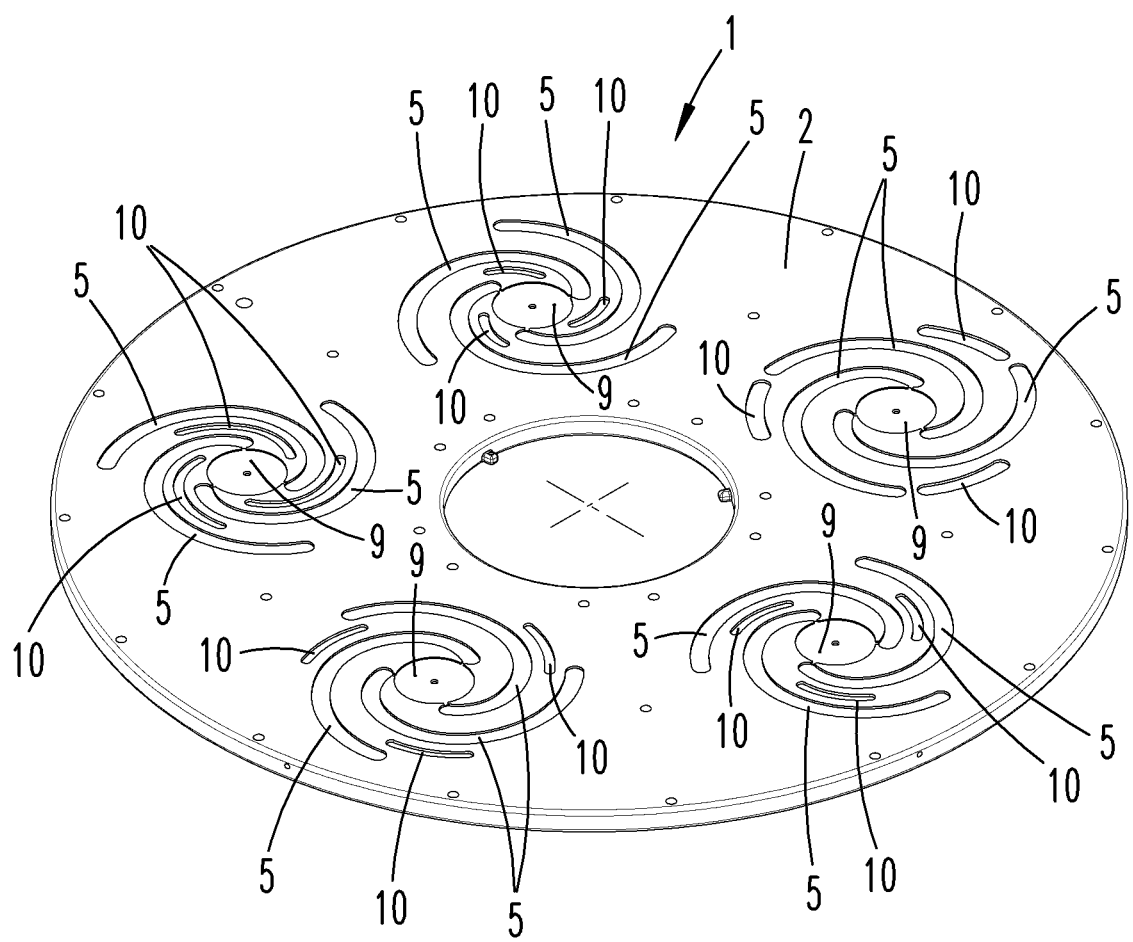
FIG. 1 shows an illustration in perspective of a susceptor, as it is used in a CVD reactor, with five circular surface sections 3, each for purposes of forming a floor of a pocket for the reception of a substrate holder; in the illustration each circular surface section has influencing elements of a different configuration for purposes of simplifying the drawn illustrations; however, the circular surface sections 3 assigned to one susceptor are preferably of the same configuration as one another.
Figure 2:
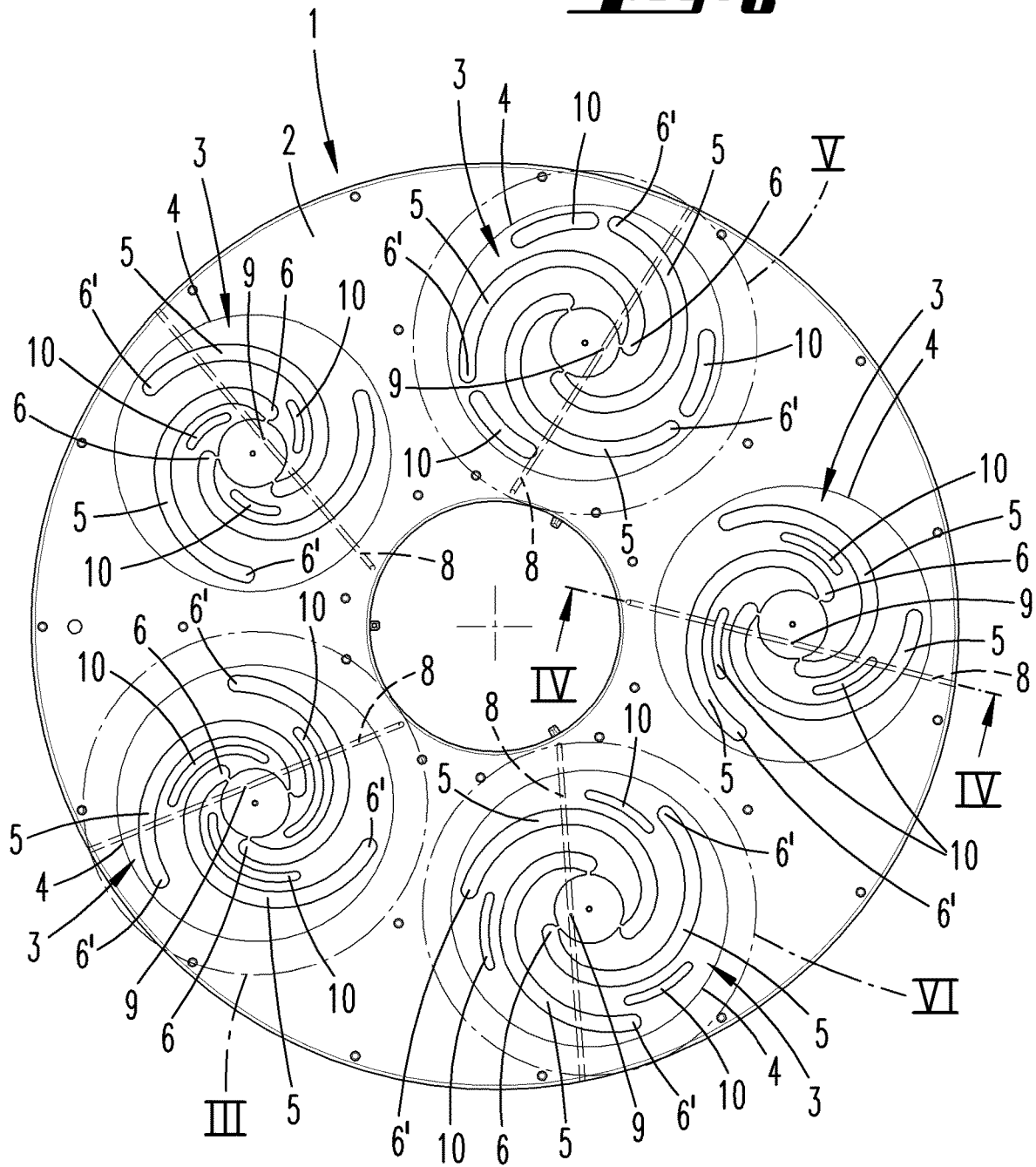
FIG. 2 shows the plan view onto the susceptor 1.

The susceptor 1 shown in FIG. 2 consists of graphite and has the shape of a circular disc. However, the susceptor 1 can also have a different shape, for example it can be designed as a polygon. Thus the configuration of a susceptor 1 in a rectangular or triangular form is also envisaged. The number of edges or corners of a polygonal susceptor can here be the same as the number of surface sections 3 that already accommodate a substrate holder 13. It preferably takes the form of a symmetrical polygon, wherein the order of symmetry corresponds to the number of surface sections 3. On a radially outer annular region a plurality of surface sections 3, in the example of embodiment five, are located in a symmetrical arrangement, in each case bounded by a boundary line 4, which in each case can form the floor of a pocket 16 (cf. FIG. 8). In the center Z of the surface section 3 a feed opening 9 is located, which is provided with a gas supply line 8, which is designed as a hole within the susceptor 1. The feed opening 9 opens out into a circular gas distribution recess 12, which is designed as a circularly symmetrical depression about the center Z.

The gas distribution recess 12 has channel openings 7 corresponding to the number of channels 5, with which the gas distribution recess 12 is connected in terms of flow to one channel 5 in each case. In the example of embodiment three channels 5 are provided. The channel opening 7 is shown in the figures as a constriction. However, it is not necessary for the channel opening to have a smaller opening width than the width of the channels 5 (see FIG. 11).

The channels 5 have a radially inner end 6, which with the channel opening 7 is connected in terms of flow to the gas distribution recess 12. The channels 5 extend along a spiral line about the center Z to a radially outer end 6'. The channels 5 extend about the center Z over an angle of arc that is greater than 180°. An influencing element, shown here as a depression 10, extends between adjacent channels 5. The depression 10 extends over an arc length of at least 30°, preferably at least 60°, preferably at least 90° about the center Z. In the example of embodiment, the width of the channels 5 is slightly greater than the width of the depression 10. The radially inner end 17 of the depression 10 lies approximately at the same radial distance as the radially inner end 6 of the channel. In the region of its radially outer end 17' the depression 10 extends approximately centrally between the two adjacent channels 5.

In the examples of embodiment of FIGS. 3 to 7, the depression 10 has the shape of an elongated trench. However, provision is also made for a multiplicity of individual depressions, which are separated from one another, to be arranged one behind another on an elongated base surface. These individual depressions can, for example, be designed as holes, and can have a circular outline. Such gas pockets can form diffusion barriers, without the need for a continuous trench to be produced.

The surface section 3 can be divided into different circular sectors. A first circular sector A, which extends over an angle of about 90°, has two channels 5 over its entire arc region. A second circular sector B, through which exactly one channel 5 extends, extends between two first circular sectors A. In the example of embodiment, the depression 10 is located partly in the first circular sector A and partly in the second circular sector B.

It is considered to be advantageous if the radially inner end 17 of the depression 10 is located in a first sector A of a circle, and the radially outer end 17' of depression 10 is located in another first circular sector A, such that the depression 10 extends through a second circular sector B.

Figure 3:
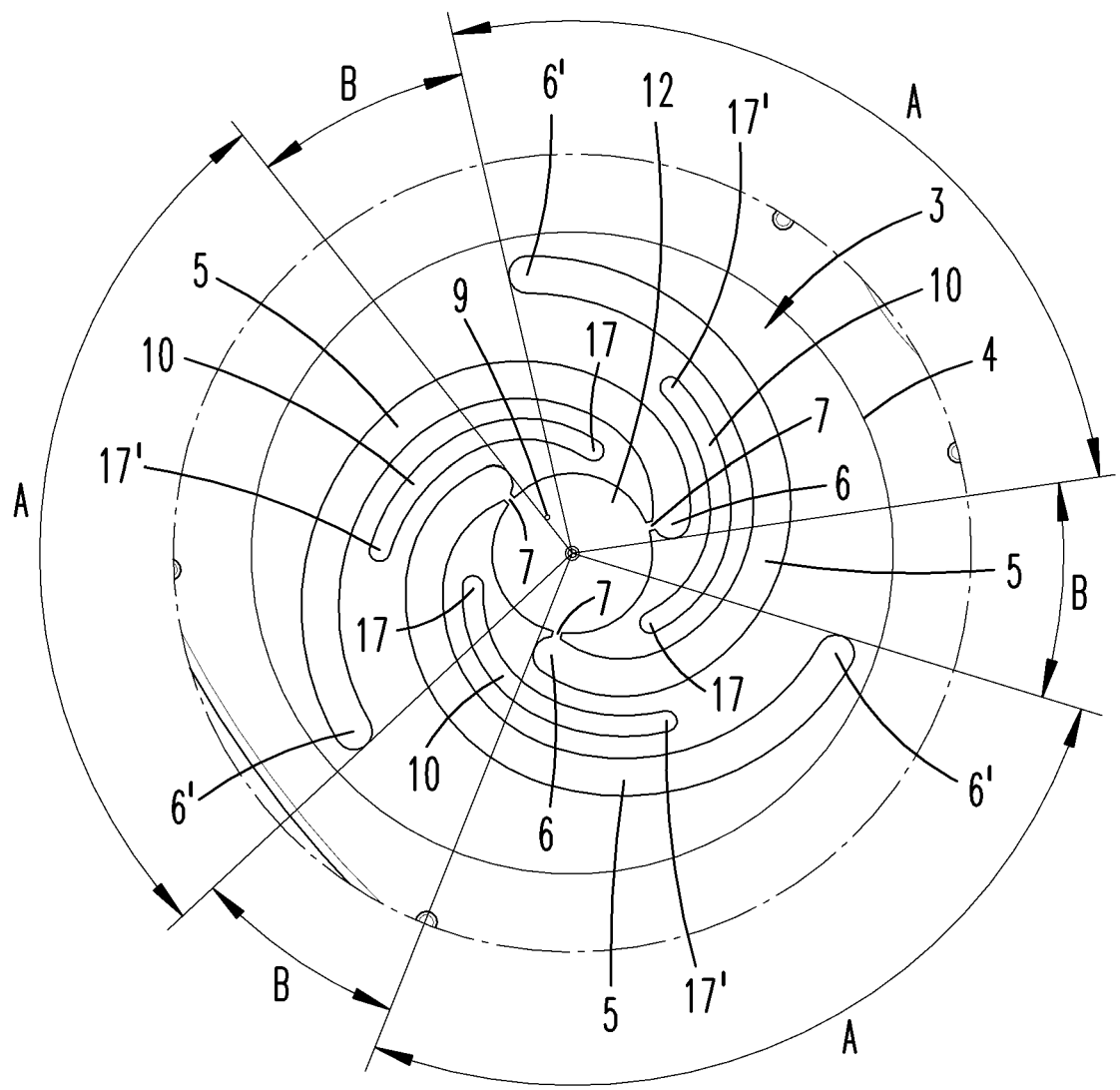
FIG. 3 shows the detail III in FIG. 2.

In the example of embodiment shown in FIG. 3, the radially outer end 17' of the depression 10 lies radially within the radially outer end 6' of the channel 5.

Here the channels 5 and the depressions 10 form a three-fold symmetry about the center Z.

Figure 5:
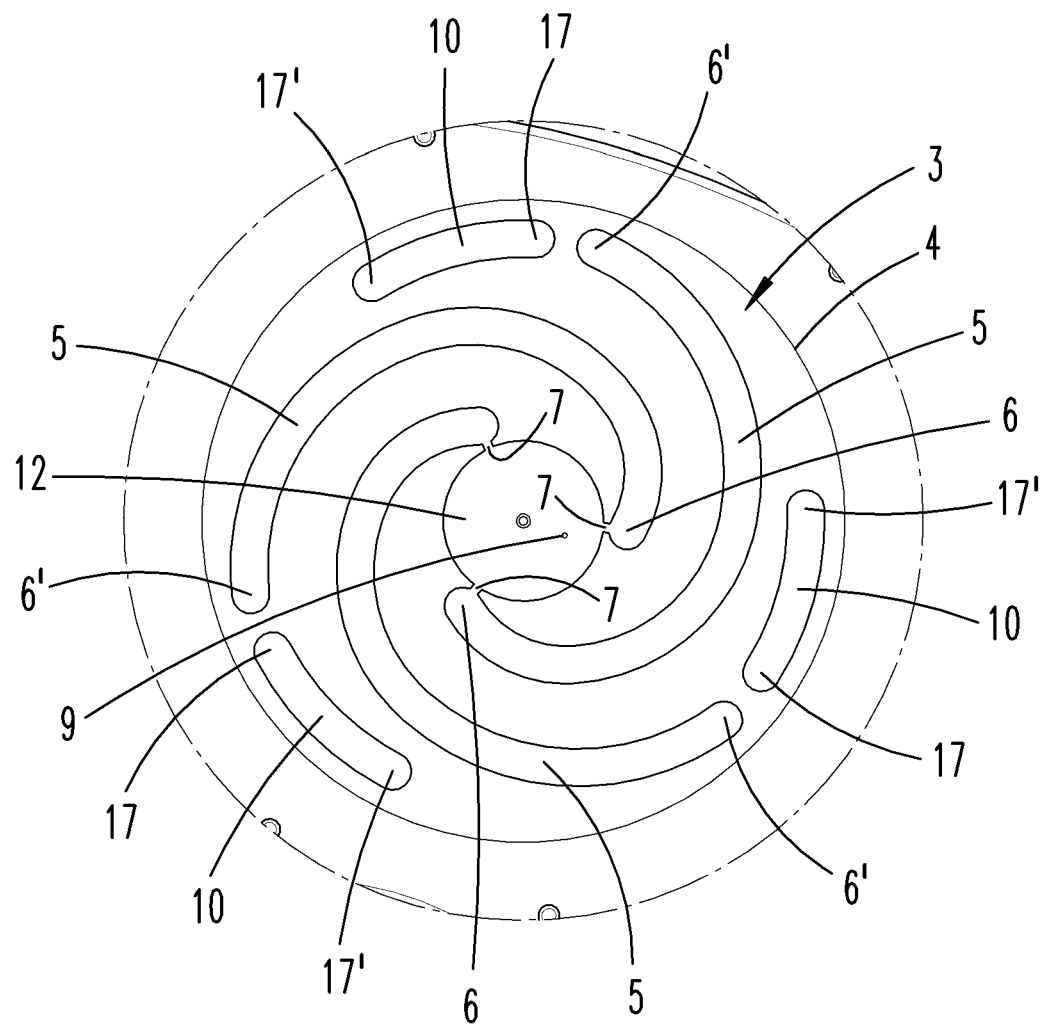
FIG. 5 shows the detail V in FIG. 2.

In the example of the embodiment shown in FIG. 5, the depressions 10 are connected to the channels 5. They lie on an extended spiral arc line, on which the channel 5 runs. Here they are connected to the radially outer end 6' of the channel 5. Here, too, a three-fold symmetry is specified. The depression 10 can extend either on a spiral line or on a circular arc line.

Figure 6:
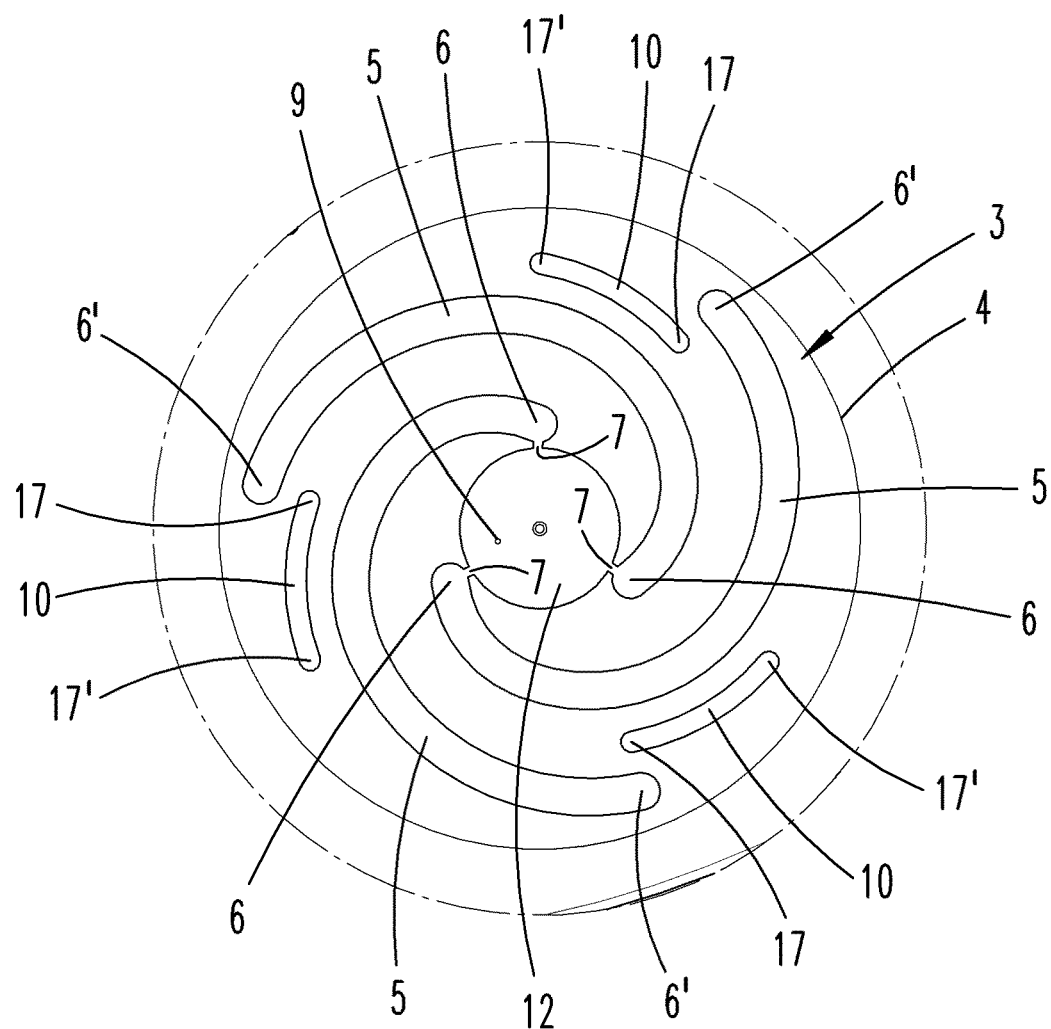
FIG. 6 shows the detail VI in FIG. 2.

In the example of the embodiment shown in FIG. 6, the depressions 10 are similarly connected to the radially outer ends 6' of the channels 5, but are offset radially inwards. Here the depression 10 can extend along a spiral line or along a circular arc line.

Figure 9:
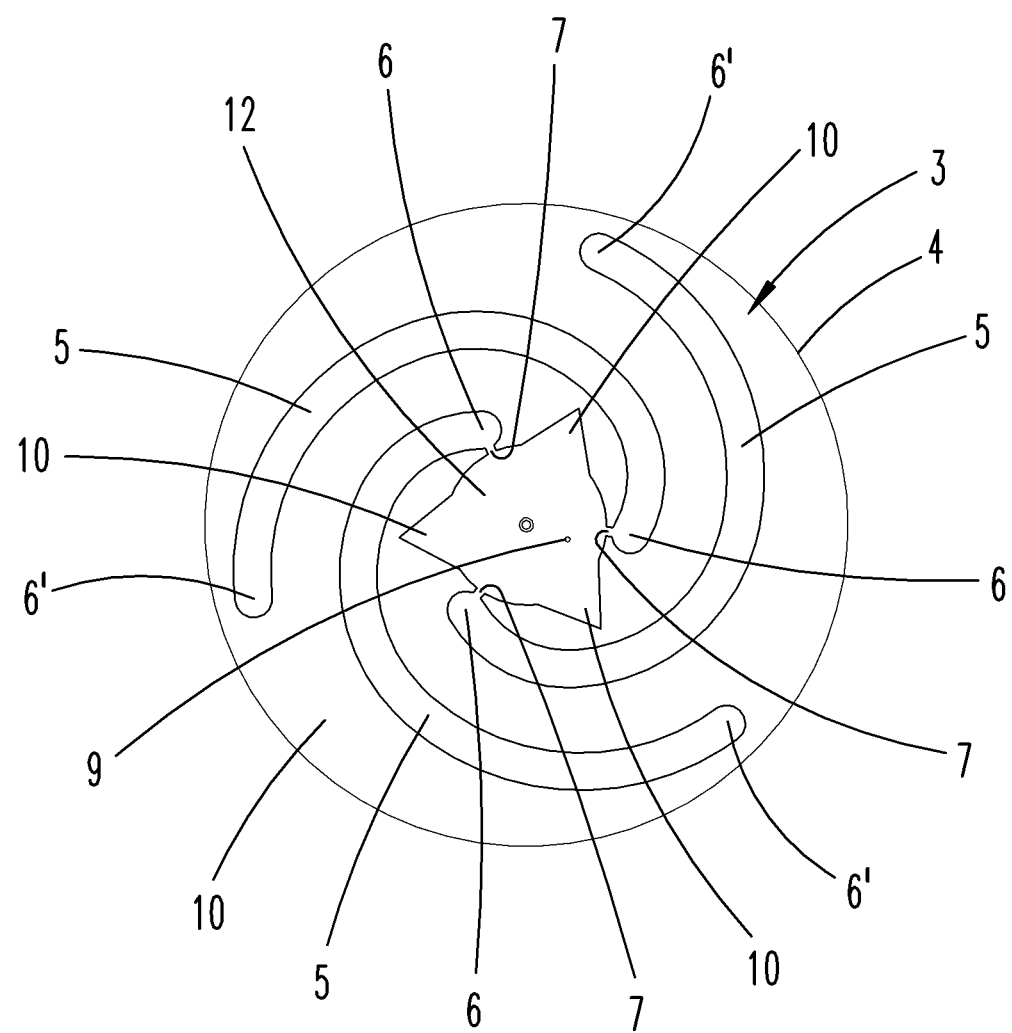
FIG. 9 shows an illustration as in FIG. 5 of a further example of embodiment, in which the depressions 10 are connected in terms of flow with a gas distribution recess 12.

In the example of the embodiment shown in FIG. 9, the depressions 10 are connected in terms of flow to the gas distribution recess 12. The depressions 10 have an essentially triangular outline, but are arranged such that only an insignificant gas flow passes through them. As in the previous examples of embodiment, insert pieces can also be positioned in the depressions 10. In this example of embodiment, the depressions 10 are connected in terms of gas flow to the rotational drive of the substrate holder. Here, too, the arrangement of the depressions 10 has the same order of symmetry as the arrangement of the channels 5.

Figure 10:
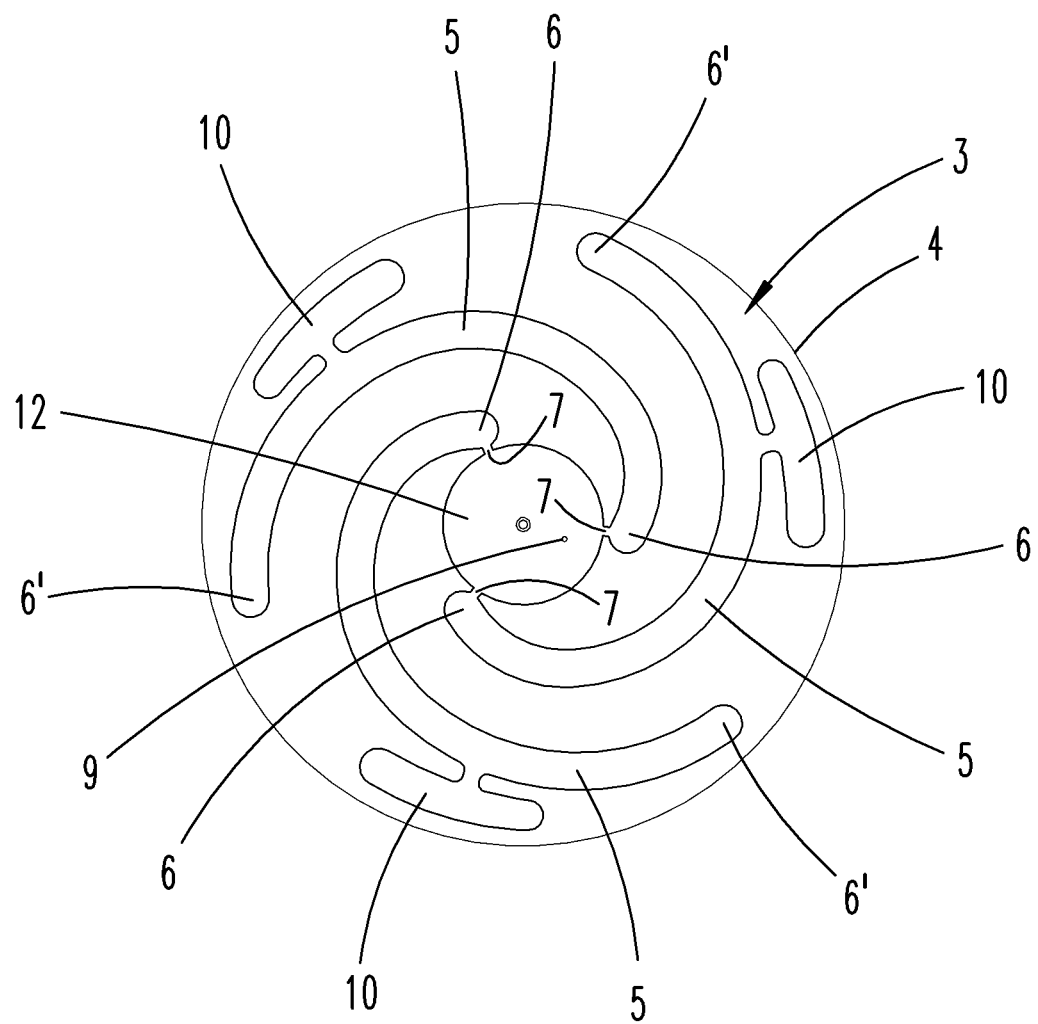
FIG. 10 shows a further example of an embodiment, in which the depressions 10 are connected in terms of flow with the channels 5.

In the example of the embodiment shown in FIG. 10, an elongated depression 10 in the edge region is connected in terms of flow to a channel 5. Here, too, insert pieces can be positioned in the depressions 10. Here too, provision can be made for the depressions to be designed such that the insert pieces positioned in them form the wall of a channel 5.

Figure 11:
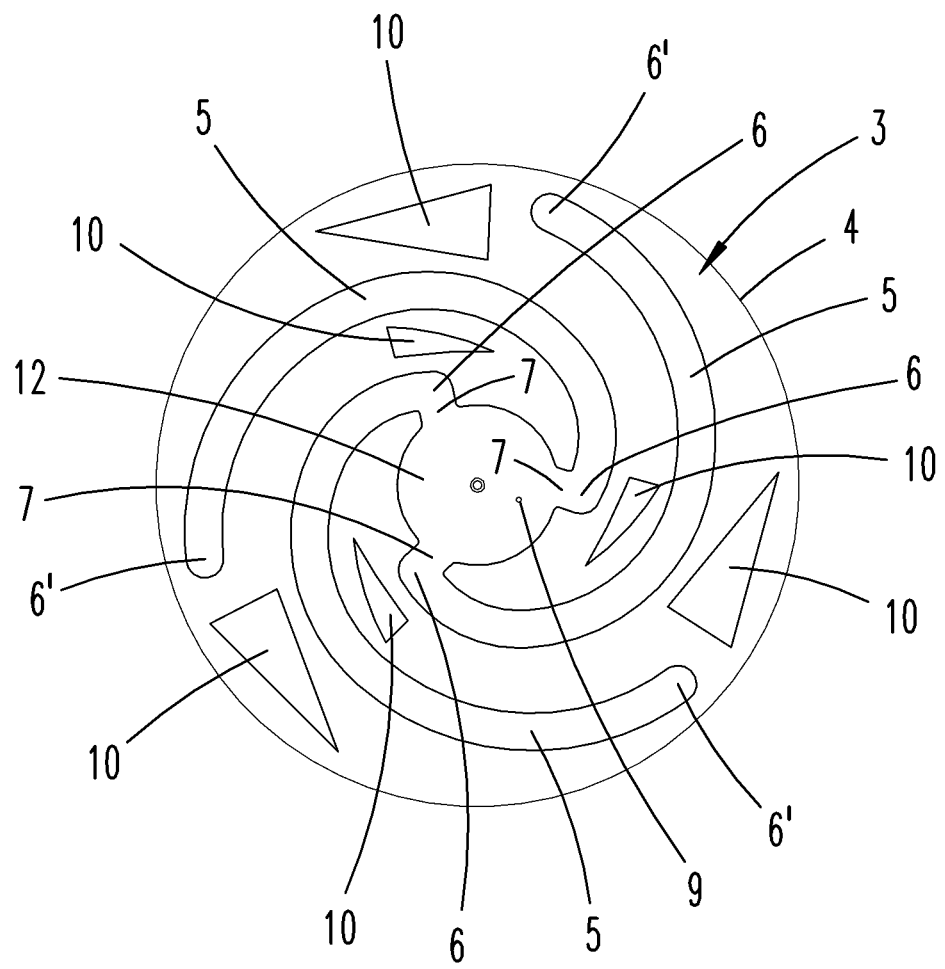
FIG. 11 shows a further example of an embodiment, in which the depressions have a triangular shape.

In the example of the embodiment shown in FIG. 11, a plurality of depressions 10 are in each case triangular in shape. In the example of embodiment shown in FIGS. 10 and 11, insert pieces can also be positioned in the depressions 10. Here the gas distribution recess 12 merges into the channel 5 without a constriction.

In the example of the embodiment shown in FIG. 12, insert pieces can also be positioned in the depressions 10. Here, a plurality of depressions 10 with a circular outline are arranged one behind another in the form of a row. The depressions 10, in this case formed by blind holes, extend along an arc line or a straight line that runs in an azimuthal direction.

In all the example embodiments, the depression 10 can also extend along a spiral running in an opposite direction to the spiral line of the channels 5. The depression can be an elongated slot, wherein the length is several times greater than the slot width. However, the depression can also have a free-form outline contour.

In so far as reference is made above to depressions 10, the description also comprises such examples of embodiment in which not only insert pieces are positioned in the depressions 10, but also such examples of embodiment in which the reference number 10 designates elevations, which are rooted in the surface sections 3, and which have a floor surface that runs above the planar surface of the surface section 3. By the omission of individual influencing elements, the arrangement of the influencing elements can also become an asymmetrical arrangement.

The above statements serve to explain the inventions recorded by the application in total, which develop the prior art, at least by means of the following combinations of features, and in each case also independently, wherein two, a plurality, or all of these combinations of features can also be combined, namely:

A susceptor, which is characterised in that one or a plurality of influencing elements, influencing the local heat transfer, are arranged in the surface section 3, and are designed as elevations, open depressions 10 in the plane, or as insert pieces 11, which are positioned in the depressions 10.

A susceptor, which is characterised in that influencing elements 10, 11 and channels 5 are arranged adjacent to one another in the azimuthal direction.

A susceptor, which is characterised in that the elevations or the depressions 10, in particular those in which insert pieces 11 are positioned, are spatially spaced apart from the channels 5, or are spatially connected to the channels 5.

A susceptor, which is characterised in that the influencing elements 10, 11, arranged on an arc line, extend about the center Z over a circular arc angle of at least 40°, preferably 60°, and in particular 80°.

A susceptor, which is characterised by a multi-fold symmetrical arrangement of the channels 5 and the influencing elements 10, 11 about the center Z.

A susceptor, which is characterised in that the feed opening 9, relative to the center of the circular surface section 3, opens out into a central gas distribution recess 12, which is connected to channel openings 7 extending in the radial direction, to which the channels 5, extending in particular along a spiral arc line, are connected.

A susceptor, which is characterised in that the influencing elements formed as elevations or depressions 10 have a closed floor, which is surrounded by a continuous wall extending from the floor of the elevation or depression 10 up to the edge of the plane.

A susceptor, which is characterised in that the insert pieces 11 are made from a material, which has a different specific thermal conductivity from that of the susceptor 1.

A susceptor, which is characterised in that a plurality of, in particular circular, depressions 10, in particular with insert pieces 11 positioned therein, are arranged one behind another in the azimuthal direction.

A susceptor, which is characterised in that the depressions 10 have a polygonal outline.

A susceptor, which is characterised in that the depth of the depression 10 decreases from the center of the surface section 3 to the edge of the surface section 3.

A susceptor, which is characterised by first circular sectors A about the center Z, through which at least two channels 5 extend, and by second circular sectors B about the center Z, through which only one channel 5 extends, wherein the angular sum of all first circular sectors A is >180° and/or the angular sum of all second circular sectors B is >90°, and/or the angular sum of all first circular sectors A is greater than the angular sum of all second circular sectors B, wherein in particular in at least one, preferably in each first circular sector A, an influencing element 10, 11 extends between the at least two channels 5 or radially outside the radially outermost channel 5, and/or wherein in at least one, preferably in every second circular sector B an influencing element 10, 11 extends in particular radially inside the channel 5 over at least a sub-sector, preferably over the entire sector, and/or wherein the angular sum of all first circular sectors A about the center Z, through which at least two of the channels 5 extend, is greater than 180°, and/or wherein in at least one, preferably in each first circular sector A, an influencing element 10, 11 extends between the at least two channels 5, or radially outside the radially outermost channel 5, over at least a sub-sector.

A use, which is characterised by a susceptor in a CVD reactor, wherein the surface section 3 forms the floor of a pocket 16, in which a substrate holder 13 is positioned.

A substrate holder arrangement, which is characterised in that the surface section 3 forms the floor of a pocket 16, in which a circular disc-shaped substrate holder 13 is positioned, which, supported on a gas cushion, can be brought into a rotational movement about the center Z by the feeding of a purge gas through the feed opening 9.

All disclosed features are essential to the invention (both individually, and also in combination with one another). In the disclosure of the application, the disclosure content of the associated/attached priority documents (copy of the prior application) is hereby also incorporated in full, also for the purpose of incorporating features of these documents in the claims of the present application. The subsidiary claims characterise, even without the features of a claimed claim, with their features independent inventive developments of the prior art, in particular in order to make divisional applications on the basis of these claims. The invention specified in each claim can additionally comprise one or a plurality of the features described in the above description, in particular with features provided with reference symbols and/or specified in the list of reference symbols. The invention also relates to forms in which individual of the features mentioned in the above description are not implemented, in particular insofar as they are recognisably dispensable for the respective purpose, or can be replaced by other technically equivalent means.

LIST OF REFERENCE SYMBOLS

1 Susceptor
2 Broad side
3 Surface section
4 Boundary line
5 Channel
6 Radially inner end
6' Radially outer end
7 Channel opening
8 Gas supply line
9 Feed opening
10 Depression
10' Floor
10" Wall
11 Insert piece
12 Gas distribution recess
13 Substrate holder
14 Gas inlet device
15 Cover plate
16 Pocket
17 Radially inner end
17' Radially outer end
A Circular sector
B Circular sector
z Center

What is claimed is:

1. A susceptor (1) for a chemical vapor deposition (CVD) reactor, the susceptor (1) comprising a circular surface section (3) on which a substrate holder (13) is supported, wherein the circular surface section (3) has channels (5), open in a direction of the substrate holder (13), that are connected in terms of flow to an in-feed opening (9) arranged at an end of a gas supply line (8), such that by feeding a gas flow through the respective channels (5) into a space between a lower face of the substrate holder (13) and a plane of the circular surface section (3), the substrate holder (13) is lifted into a ventilated position and is rotationally driven by an azimuthal velocity component of the gas flow about a center (Z) of the circular surface section (3), wherein one or more influencing elements (10, 11), which influence a transfer of heat between a substrate and the substrate holder (13), are arranged on the circular surface section (3) of the susceptor (1), are configured as elevations (10) of the susceptor (1) that project from the plane of the circular surface section (3) into the space between the lower face of the substrate holder (13) and the plane of the circular surface section (3), and extend over a circular arc angle of at least 40° about the center (Z) of the circular surface section (3), and, wherein at least a portion of the one or more influencing elements (10, 11) and at least a portion of the channels (5) lie on a common azimuthal line that is concentric with the circular surface section (3) having the center (Z).

2. The susceptor (1) of claim 1, wherein the one or more influencing elements (10, 11) are spatially spaced apart from the channels (5), or are spatially connected to the channels (5).

3. The susceptor (1) of claim 1, wherein the one or more influencing elements (10, 11) extend over the circular arc angle of at least 60° about the center (Z) of the circular surface section (3).

4. The susceptor (1) of claim 1, further comprising a multi-fold symmetrical arrangement of the channels (5) and the one or more influencing elements (10, 11) about the center (Z) of the circular surface section (3).

5. The susceptor (1) of claim 1, further comprising:
first circular sectors (A) about the center (Z), through which at least two of the channels (5) extend; and
second circular sectors (B) about the center (Z), through which only one of the channels (5) extends,
wherein one or more of:
(i) an angular sum of all first circular sectors (A) is greater than 180°, and/or an angular sum of all second circular sectors (B) is greater than 90°, and/or the angular sum of all first circular sectors (A) is greater than the angular sum of all second circular sectors (B),
(ii) in at least one of the first circular sectors (A), one of the one or more influencing elements (10, 11) extends between two of the channels (5), or radially outside a radially outermost one of the channels (5) over at least a sub-sector, and in at least one of the second circular sectors (B), one of the one or more influencing elements (10, 11) extends radially inside one of the channels (5) over at least a sub-sector.

6. A device for a chemical vapor deposition (CVD) reactor, the device comprising one or more influencing elements (10, 11) and a susceptor (1), the susceptor (1) comprising a circular surface section (3), on which a substrate holder (13) is supported, wherein the circular surface section (3) has channels (5), open in a direction of the substrate holder (13), that are connected in terms of flow to an in-feed opening (9) arranged at an end of a gas supply line (8), such that by feeding a gas flow through the respective channels (5) into a space between a lower face of the substrate holder (13) and a plane of the circular surface section (3), the substrate holder (13) is lifted into a ventilated position and is rotationally driven by an azimuthal velocity component of the gas flow about a center (Z) of the circular surface section (3), wherein the one or more influencing elements (10, 11), which influence a transfer of heat between a substrate and the substrate holder (13), are arranged in the circular surface section (3) of the susceptor (1), the one or more influencing elements (10, 11) comprising insert pieces (11) that are inserted in depressions (10) of the circular surface section (3), the insert pieces (11) made from a material that has a different specific thermal conductivity from that of the susceptor (1), and wherein at least a portion of the one or more influencing elements (10, 11) and at least a portion of the channels (5) lie on a common azimuthal line that is concentric with the circular surface section (3) having the center (Z).

7. The device of claim 6, wherein the one or more influencing elements (10, 11) are spatially spaced apart from the channels (5), or are spatially connected to the channels (5).

8. The device of claim 6, wherein the one or more influencing elements (10, 11) extend over a circular arc angle of at least 60° about the center (Z) of the circular surface section (3).

9. The device of claim 6, wherein the in-feed opening (9), relative to the center (Z) of the circular surface section (3), opens out into a central gas distribution recess (12), which is connected to channel openings (7) extending in the radial direction, to which the channels (5), extending along a spiral arc line, are connected.

10. The device of claim 6, wherein a depth of each of the depressions (10) decreases from the center (Z) of the circular surface section (3) to an edge of the circular surface section (3).

11. The device of claim 6, further comprising:
first circular sectors (A) about the center (Z), through which at least two of the channels (5) extend; and
second circular sectors (B) about the center (Z), through which only one of the channels (5) extends,
wherein one or more of:
(i) an angular sum of all first circular sectors (A) is greater than 180°, and/or an angular sum of all second circular sectors (B) is greater than 90°, and/or the angular sum of all first circular sectors (A) is greater than the angular sum of all second circular sectors (B),
(ii) in at least one of the first circular sectors (A), one of the one or more influencing elements (10, 11) extends between two of the channels (5), or radially outside a radially outermost one of the channels (5) over at least a sub-sector, and
(iii) in at least one of the second circular sectors (B), one of the one or more influencing elements (10, 11) extends radially inside one of the channels (5) over at least a sub-sector.

12. A susceptor (1) for a chemical vapor deposition (CVD) reactor, the susceptor (1) comprising a circular surface section (3) on which a substrate holder (13) is supported, wherein the circular surface section (3) has channels (5), open in a direction of the substrate holder (13), that are connected in terms of flow to an in-feed opening (9) arranged at an end of a gas supply line (8), such that by feeding a gas flow through the respective channels (5) into a space between a lower face of the substrate holder (13) and a plane of the circular surface section (3), the substrate holder (13) is lifted into a ventilated position and is rotationally driven by an azimuthal velocity component of the gas flow about a center (Z) of the circular surface section (3),
wherein one or more open depressions (10), which influence a transfer of heat between a substrate and the substrate holder (13), are arranged in the circular surface section (3) of the susceptor (1) and open towards the plane of the circular surface section (3),
wherein the one or more open depressions (10) are completely filled with a gas,
wherein, for each of the one or more open depressions (10), the open depression (10) comprises a floor (10') and a peripheral wall (10") that surrounds the floor (10'), the floor (10') is spaced apart from the plane of the circular surface section (3) by a first distance, a height of the peripheral wall (10") is equal to the first distance, the floor (10') is closed such that the gas cannot enter into the open depression (10) through the floor (10'), and the peripheral wall (10") is closed such that the gas cannot enter the open depression (10) through the peripheral wall (10"), and
wherein at least a portion of the one or more open depressions (10) and at least a portion of the channels (5) lie on a common azimuthal line that is concentric with the circular surface section (3) having the center (Z).

13. The susceptor (1) of claim 12, wherein the one or more open depressions (10) and the channels (5) are arranged adjacent to one another in an azimuthal direction.

14. The susceptor (1) of claim 12, wherein the one or more open depressions (10) extend over a circular arc angle of at least 60° about the center (Z) of the circular surface section (3).

15. The susceptor (1) of claim 12, further comprising a multi-fold symmetrical arrangement of the channels (5) and the one or more open depressions (10) about the center (Z) of the circular surface section (3).

16. The susceptor (1) of claim 12, further comprising:
first circular sectors (A) about a center (Z), through which at least two of the channels (5) extend; and
second circular sectors (B) about the center (Z), through which only one of the channels (5) extends,
wherein one or more of:
(i) an angular sum of all first circular sectors (A) is greater than 180°, and/or an angular sum of all second circular sectors (B) is greater than 90°, and/or the angular sum of all first circular sectors (A) is greater than the angular sum of all second circular sectors (B),
(ii) in at least one of the first circular sectors (A), one of the one or more open depressions (10) extends between two of the channels (5), or radially outside a radially outermost one of the channels (5) over at least a sub-sector, and (iii) in at least one of the second circular sectors (B), one of the one or more open depressions (10) extends radially inside one of the channels (5) over at least a sub-sector.

\* \* \* \* \*